United States Patent
Cheng et al.

(10) Patent No.: US 11,592,477 B2
(45) Date of Patent: Feb. 28, 2023

(54) TEST HANDLER HAVING MULTIPLE TESTING SECTORS

(71) Applicant: ASMPT SINGAPORE PTE. LTD., Singapore (SG)

(72) Inventors: Chi Wah Cheng, Hong Kong (HK); Kai Fung Lau, Hong Kong (HK); Yu Sze Cheung, Hong Kong (HK)

(73) Assignee: ASMPT SINGAPORE PTE. LTD., Singapore (SG)

( * ) Notice: Subject to any disclaimer, the term of this patent is extended or adjusted under 35 U.S.C. 154(b) by 770 days.

(21) Appl. No.: 16/562,628

(22) Filed: Sep. 6, 2019

(65) Prior Publication Data
US 2020/0341056 A1      Oct. 29, 2020

Related U.S. Application Data

(63) Continuation-in-part of application No. 16/396,996, filed on Apr. 29, 2019, now abandoned.

(51) Int. Cl.
*G01R 31/28*      (2006.01)
*H05K 13/04*      (2006.01)

(52) U.S. Cl.
CPC ..... *G01R 31/2893* (2013.01); *G01R 31/2867* (2013.01); *H05K 13/0404* (2013.01)

(58) Field of Classification Search
CPC ............... G01R 31/68; G01R 31/2893; G01R 31/2874; G01R 31/2868; G01R 1/0466
See application file for complete search history.

(56) References Cited

U.S. PATENT DOCUMENTS

2014/0328652 A1* 11/2014 Cheng ............... H01L 21/67132
                                                                414/223.01
2016/0216322 A1*  7/2016 Cheung .............. G01R 31/2893

* cited by examiner

*Primary Examiner* — Tung X Nguyen
(74) *Attorney, Agent, or Firm* — Ostrolenk Faber LLP

(57) ABSTRACT

A test handler comprising a primary rotary turret comprising pick heads for transporting electronic components, and a secondary rotary turret arranged and configured to receive electronic components directly or indirectly from the primary rotary turret, the secondary rotary turret including multiple separate test sectors having component carriers for carrying the electronic components received from the primary rotary turret, wherein the multiple test sectors are rotatably movable relative to one another. The test handler also comprises at least one testing device positioned along a periphery of the secondary rotary turret, wherein the component carriers of the respective test sectors are operative to convey the electronic components to a position of the at least one testing device for testing.

20 Claims, 8 Drawing Sheets

TEST HANDLER HAVING MULTIPLE TESTING SECTORS

CROSS-REFERENCE TO RELATED APPLICATION

This application is a continuation-in-part of U.S. patent application Ser. No. 16/396,996, filed on Apr. 29, 2019, which is incorporated herein by reference in its entirety.

FIELD OF THE INVENTION

The invention relates to a test handler for testing electronic components, and in particular to a test handler for testing electronic components with high throughput.

BACKGROUND

After singulation and assembly, test handlers are normally used to test electronic components to ensure conformance with customers' requirements. One type of test handler is a conventional turret test handler 100, a layout of which is shown in FIG. 1. The electronic components to be tested are fed to a rotary turret 102 by an input module 104, such as a vibration bowl feeder. The electronic components to be tested are individually picked up by pick heads 106 fixed on a circumference of the rotary turret 102, and are then transported to various testing stations 108 and processing stations 110 located at fixed positions around the circumference of the rotary turret 102, for performing one or more tests and processing on the electronic components.

Due to sequential handling, where the electronic components require long test times during testing, a turret test handler 100 is normally not preferred because the overall time taken for completing a testing cycle would take too long and forms a bottleneck. A testing cycle for a turret test handler 100 generally comprises the time taken for transferring an electronic component and the time taken to test it. In a conventional turret test handler 100, the rotary turret 102 would have to remain idle in its position until testing at a particular testing station 108 is complete. Thereafter, the rotary turret 102 would pick up the electronic component and either convey it to another testing station 108 for further testing or transfer it to an output module 112 for removal. Hence, the bottleneck of a turret test handler 100 testing process is usually the idle time incurred at the testing stations 108. This can be quite substantial, especially if a test performed at one of the testing stations 108 is particularly long. In other words, the overall time taken for a testing cycle would be largely determined by the slowest test performed. Therefore, it would be beneficial to reduce or eliminate the impact of long test times on the overall testing cycle process time.

SUMMARY OF THE INVENTION

It is thus an object of the invention to seek to provide a test handler that reduces or eliminates the impact of long test times on the overall test testing cycle process time so as to improve its overall throughput.

According to a first aspect of the present invention, there is provided a test handler comprising: a primary rotary turret comprising pick heads for transporting electronic components; a secondary rotary turret arranged and configured to receive electronic components directly or indirectly from the primary rotary turret, the secondary rotary turret including multiple separate test sectors having component carriers for carrying the electronic components received from the primary rotary turret, wherein the multiple test sectors are rotatably movable relative to one another; and at least one testing device positioned along a periphery of the secondary rotary turret, wherein the component carriers of the respective test sectors are operative to convey the electronic components to a position of the at least one testing device for testing.

According to a second aspect of the present invention, there is provided a method for testing electronic components using a test handler, comprising the steps of: transporting electronic components with pick heads of a primary rotary turret towards a secondary rotary turret including multiple test sectors; transferring the electronic components from the pick heads of the primary rotary turret directly or indirectly to component carriers comprised in a first test sector of the secondary rotary turret; transporting the electronic components received by the component carriers of the first test sector to a position of the at least one testing device positioned along a periphery of the secondary rotary turret for testing; and testing the electronic components received by the component carriers of the first test sector at the at least one testing device while transferring further electronic components between the primary rotary turret and a second test sector of the secondary rotary turret.

These and other features, aspects, and advantages will become better understood with regard to the description section, appended claims, and accompanying drawings.

BRIEF DESCRIPTION OF THE DRAWINGS

Embodiments of the present invention will now be described, by way of example only, with reference to the accompanying drawings, in which.

In the drawings, like parts are denoted by like reference numerals.

DETAILED DESCRIPTION OF THE PREFERRED EMBODIMENTS OF THE INVENTION

Figure 1:
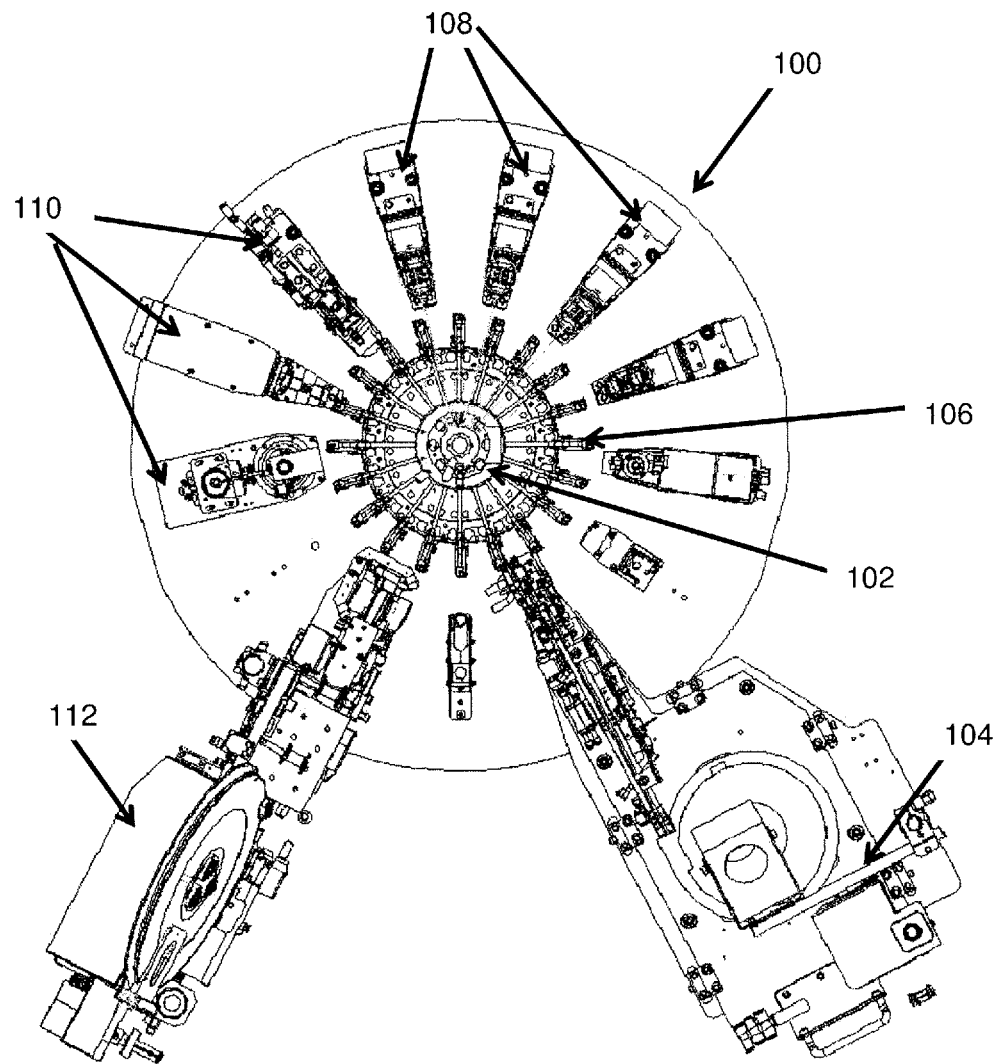
FIG. 1 shows a layout of a conventional turret test handler.
Figure 2:
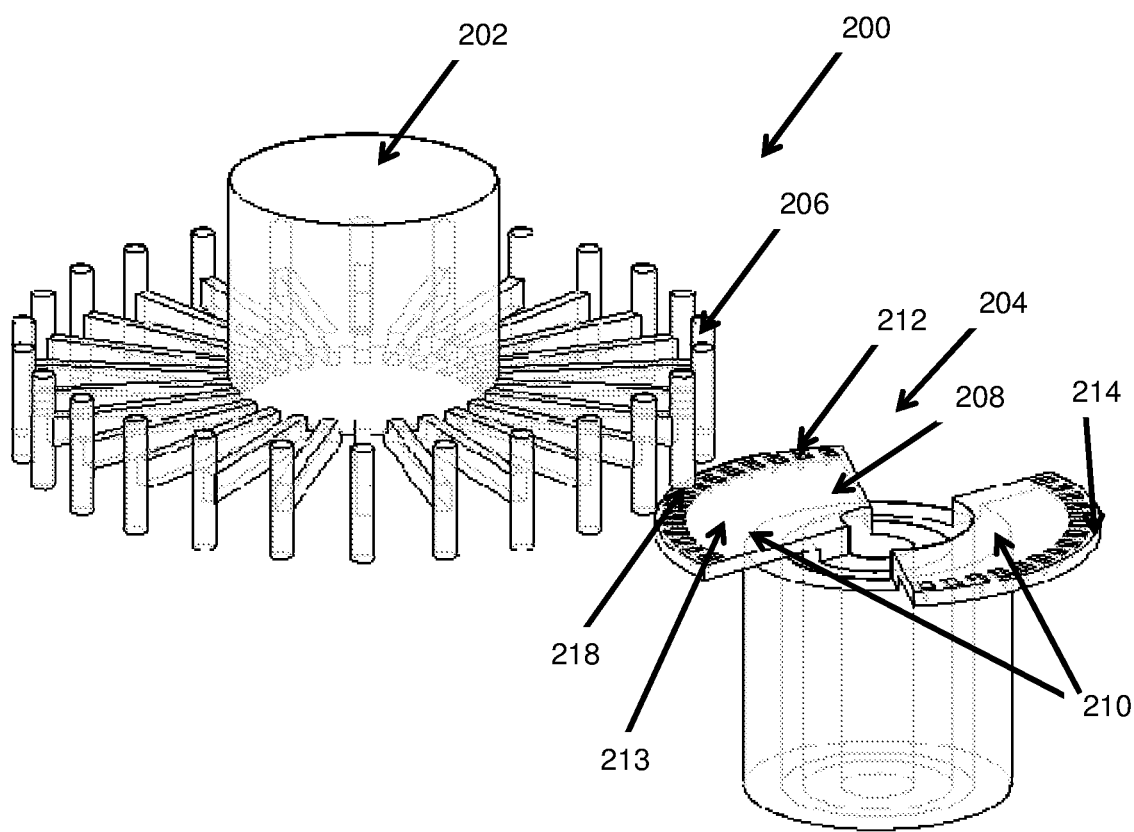
FIG. 2 shows a schematic diagram of a test handler according to a first preferred embodiment of the present invention.

FIG. 2 shows a schematic diagram of a test handler 200 according to a first preferred embodiment of the present invention. The test handler 200 comprises a primary rotary turret 202 comprising a plurality of pick heads 206 equally spaced along a circumference of the primary rotary turret 202, and a secondary rotary turret 204 located at a position that is adjacent to the circumference of the primary rotary turret 202. The pick heads 206 are for transporting electronic components to and from the secondary rotary turret 204, which is arranged and configured to receive the electronic components from the pick heads 206 of the primary rotary turret 202.

The secondary rotary turret 204 comprises a multi-sector test table 208, which comprises two independently rotatably movable separate test sectors 210. Each test sector 210 comprises a plurality of component carriers 212 located along or adjacent an arc 214 of the test sector 210, and each component carrier 212 being configured to hold or carry a respective electronic component received from the primary rotary turret 202. The arcs 214 of the test sectors 210 are positonable to be located adjacent to the circumference of the primary rotary turret 202 at a loading and unloading position 218. In other words, each test sector 210 comprises an arched portion 213, which is positionable at a first position or loading and unloading position 218 adjacent the circumference of the primary rotary turret 202. The component carriers 212 may be located adjacent to a perimeter of the arched portion 213. The test sectors 210 are generally independently rotatable relative to each other about a common axis. In particular, the component carriers 212 may be located adjacent to perimeter of the arched portion 213 which is at an arc 214 remote from the common axis.

Figure 3:
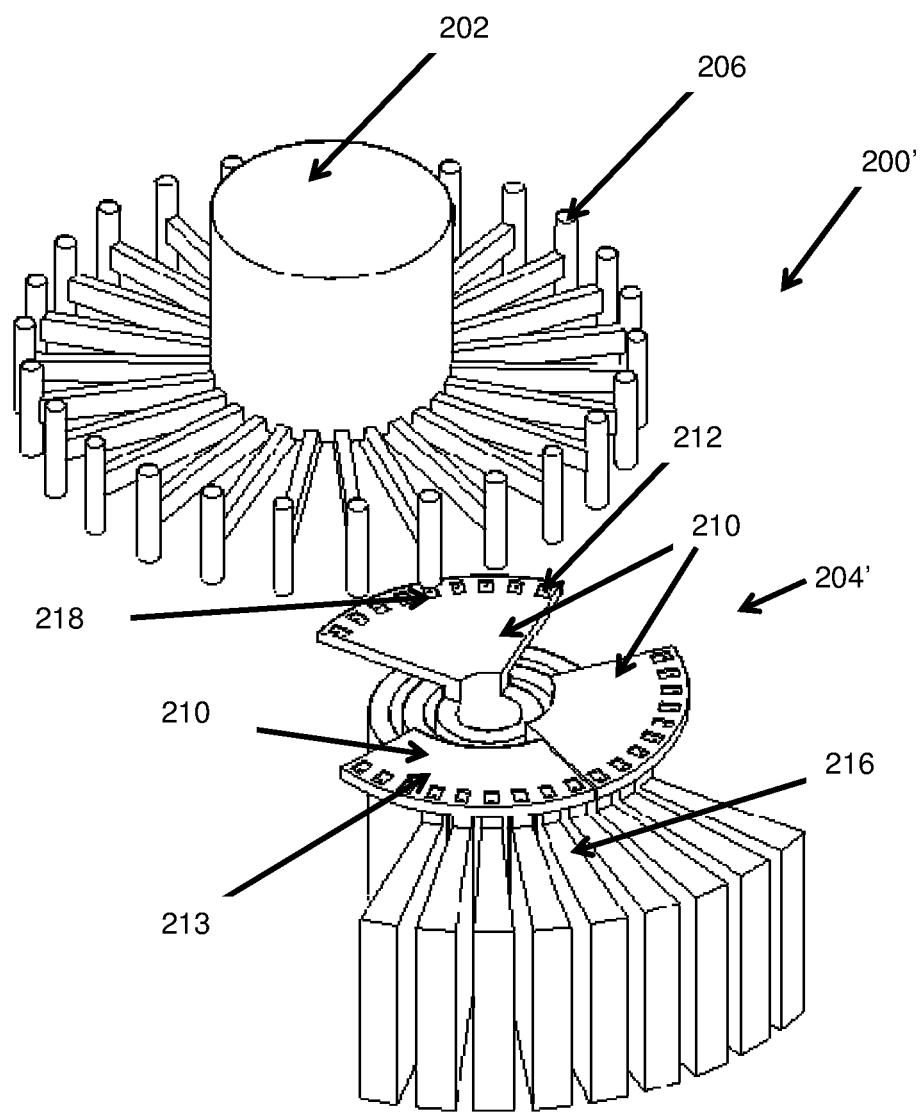
FIG. 3 illustrates the test handler having a secondary rotary turret comprising three test sectors.
Figure 4:
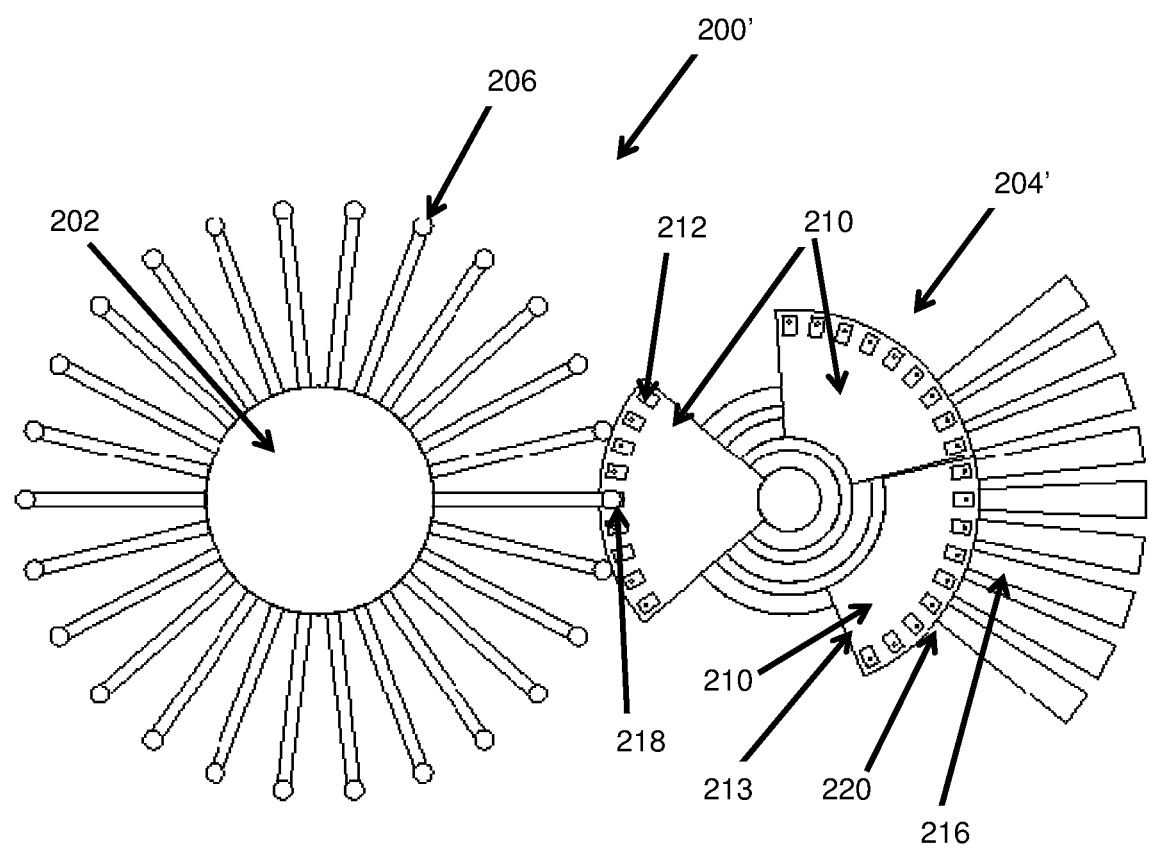
FIG. 4 illustrates the plan view of the test handler of FIG. 3.

The secondary rotary turret 204 may comprise more than two test sectors 210, for instance, three test sectors 210 as illustrated schematically in FIG. 3. FIG. 4 shows a plan view of the test handler 200' of FIG. 3. The test sectors 210 are movable or rotatable within a plane. The test sectors 210 may either move or rotate within the same plane or move within different planes, and thus may overlap one another from a plan view of the secondary rotary turret 204. At least one testing device 216 may be positioned alongside a periphery of the secondary rotary turret 204', at positions that correspond to component carriers 212 along the arcs 214 of the test sectors 210. The at least one testing device 216 is operative to receive the electronic components from the component carriers 212 for testing.

Electronic components that are supplied by an input module 104 are picked up and carried by the pick heads 206 on the primary rotary turret 202, and moved or transported towards the secondary rotary turret 204 to the loading and unloading position 218 by rotation of the primary rotary turret 202. The electronic components are then loaded onto the component carriers 212 of a respective test sector 210 of the secondary rotary turret 204. The electronic components transferred onto the test sector 210 are then conveyed by rotation of the test sector 210 of the secondary rotary turret 204' to a second or testing position 220 adjacent to the at least one testing device 216. In other words, the arched portion 213 is positionable at the second position or testing position 220 adjacent the at least one testing device 216. At the multiple testing positions 220, the at least one testing device 216 are configured and operative to receive each of the electronic components from the component carriers 212 for testing.

While a test sector 210 is stationary at the testing positions 220 and waiting for testing of the electronic components to be completed, the test handler 200 may simultaneously perform other actions so that such idling time does not affect the overall testing process cycle time. For instance, the pick heads 206 on the primary rotary turret 202 may continue to pick up and carry other electronic components from the input module. Further, the pick heads 206 may simultaneously load untested electronic components into the component carriers 212 of a test sector 210 or unload tested electronic components from the component carriers 212 at the loading and unloading position 218. Moreover, the pick heads 206 may concurrently transport tested electronic components to an output module 112 for removal from the test handler 200. This ensures that, unlike in the prior art, the primary rotary turret 202 need not remain idle while electronic components are being tested.

Multiple testing devices 216 may be configured to conduct a same type of test on the electronic components so as to considerably increase testing throughput. The tested electronic components are thereafter returned onto the component carriers 212 at the testing positions 220 and conveyed by rotation to the loading and unloading position 218 to be unloaded by the pick heads 206 on the primary rotary turret 202.

While the electronic components in one test sector are being loaded onto or unloaded from the component carriers 212 at the loading and unloading position 218, one or more test sectors 210 may be located at the testing positions 220 for the electronic components to be tested. Thus, once testing has completed for a batch of electronic components in a test sector 210, another test sector 210 containing untested electronic components loaded onto its component carriers 212 may immediately take the place of the previous test sector 210, thus reducing idling time and resulting in a much shorter testing process cycle.

Figure 5:
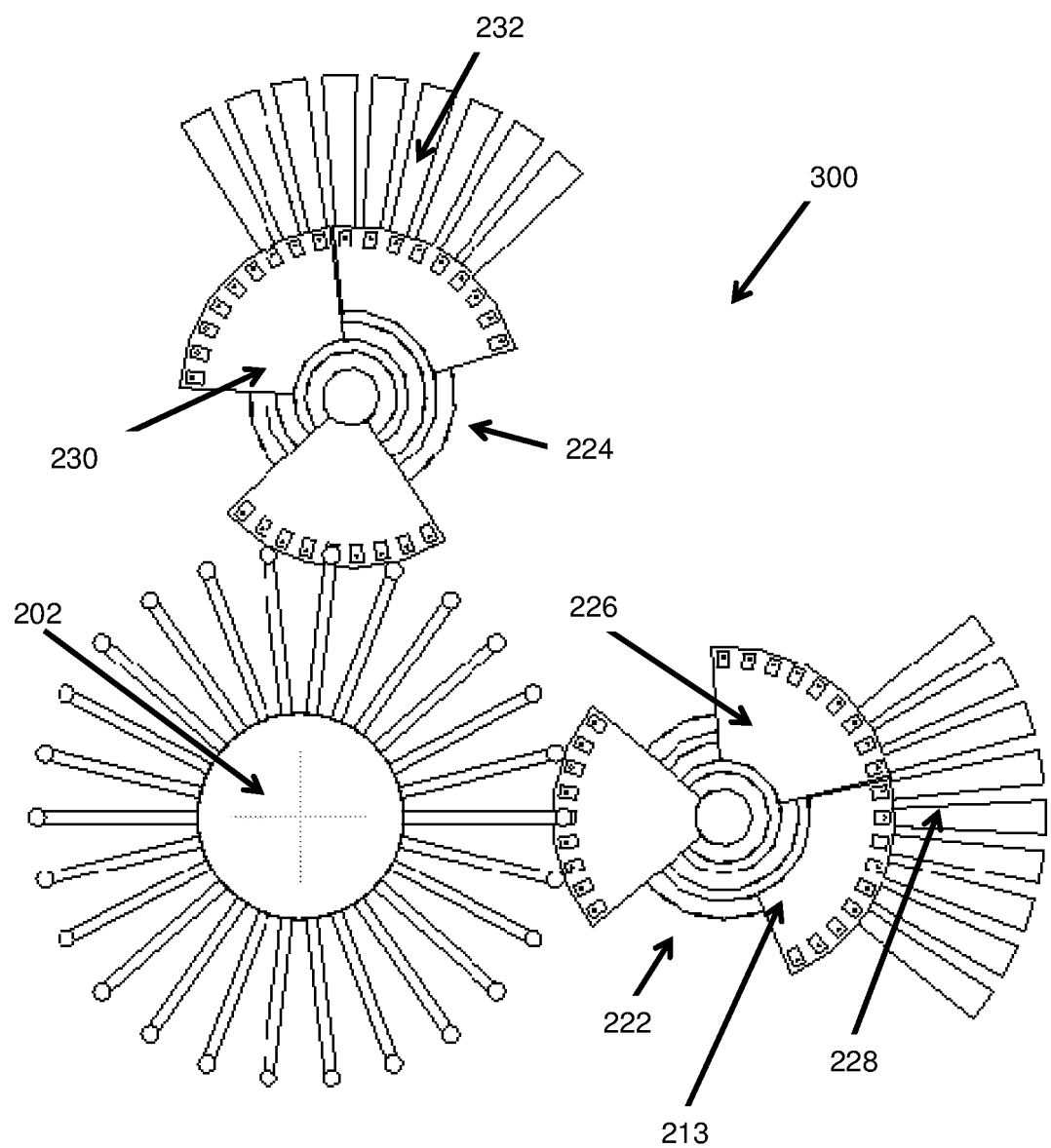
FIG. 5 shows a plan view of a test handler according to a second preferred embodiment of the invention.

FIG. 5 is a plan view of a test handler 300 according to a second preferred embodiment of the invention. The test handler 300 comprises a first secondary rotary turret 222 and a second secondary rotary turret 224 positioned next to a circumference of a primary rotary turret 202. The first secondary rotary turret 222 has a first multi-sector test table 226 with a first series of testing devices 228 located along its periphery, and the second secondary rotary turret 224 has a second multi-sector test table 230 with a second series of testing devices 232 located along its periphery. The first secondary rotary turret 222 and the second secondary rotary turret 224 comprises multiple separate test sectors which comprises component carriers for receiving electronic components from the primary rotary turret 202. The first series of testing devices 228 and the second series of testing devices 232 may perform the same type of tests or different types of tests, thus permitting the test handler 300 to be specifically configured to cater to different needs.

For instance, if a specific test is particularly time-consuming, both the first and second series of testing devices 228, 232 may be configured to perform this same test in order to improve the throughput of the test handler 300. In this case, electronic components are transferred either to the first series of testing devices 228 or to the second series of testing devices 232 for the same tests.

Alternatively, the first series of testing devices 228 and the second series of testing devices 232 may perform different tests. Hence, there is flexibility to customize the first and second series of testing devices 228, 232 in order to cater to different needs. In this case, after the electronic components have been tested at the first series of testing devices 228, the electronic components would then be transferred to the second series of testing devices 232 via the primary rotary turret 202 to undergo different tests.

Figure 6:
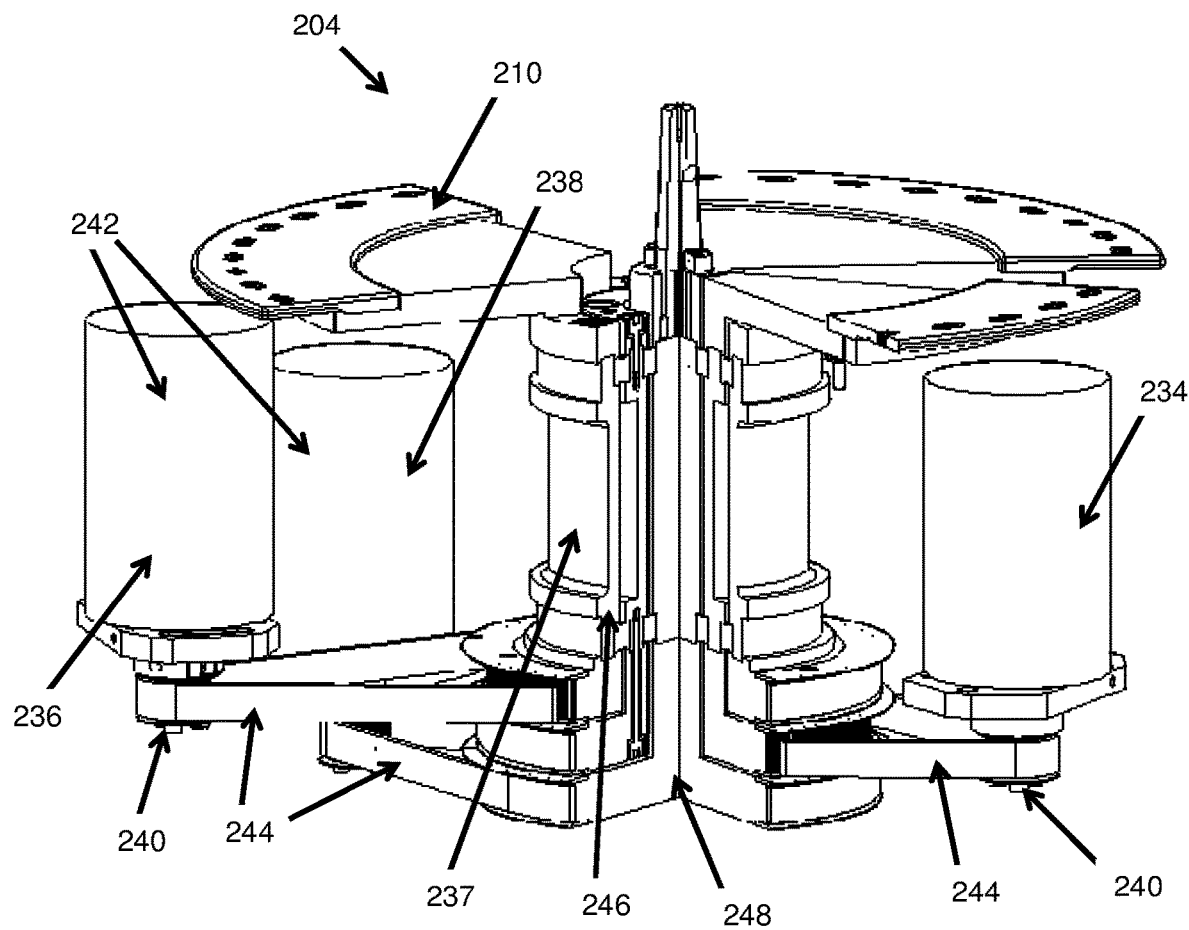
FIG. 6 illustrates servo motors of a secondary rotary turret useable for rotating respective test sectors according to the preferred embodiments of the invention.

FIG. 6 illustrates servo motors 234, 236, 238 of a secondary rotary turret 204 useable for rotating respective test sectors 210 according to the preferred embodiments of the invention.

Each servo motor 234, 236, 238 comprises a driver 242 for driving a shaft (not shown) connected to an output pulley 240. Each output pulley 240 is operationally linked to a respective test sector 210, which is mounted on a columnar support 237, via a respective belt 244 and a corresponding rotary mechanism 246. Each test sector 210 mounted on its respective columnar support 237 is coupled to its corresponding servo motor 234, 236, 238. The three rotary mechanisms 246 are concentric and rotate about a common axis 248. The drivers 242 control the amount of rotation of the shafts and hence the output pulleys 240, which in turn determine positions to which the respective test sectors 210 would rotate and the directions in which they turn. The three servo motors 234, 236, 238 are configured to allow the three test sectors 210 to be independently controlled and moved.

Figure 7A:
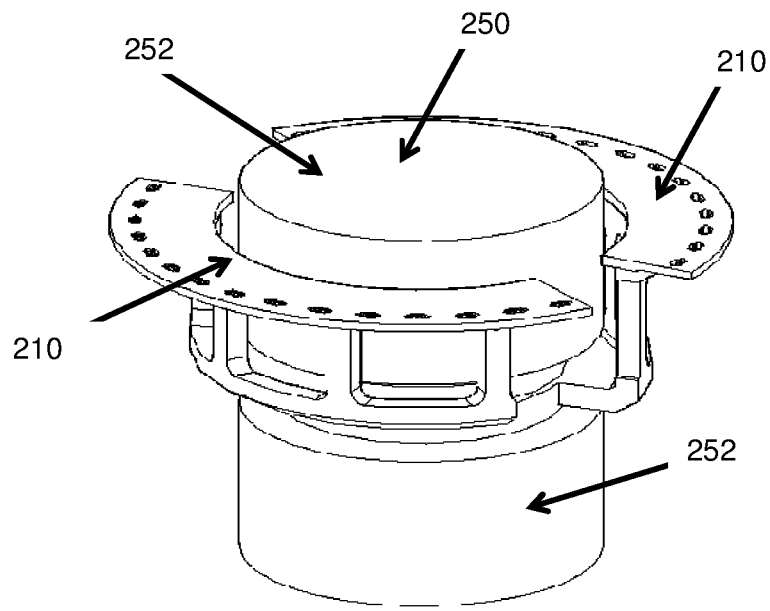
FIGS. 7A and 7B illustrate a direct drive motor of a secondary rotary turret useable for rotating respective test sectors according to the preferred embodiments of the invention.
Figure 7B:
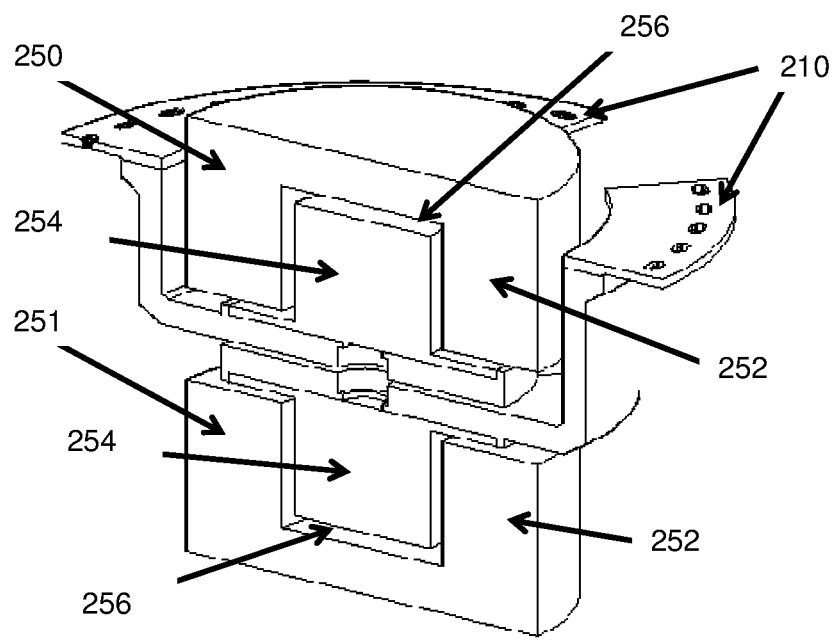

FIGS. 7A and 7B illustrate direct drive motors 250, 251 of a secondary rotary turret 204 useable for rotating respective test sectors 210 according to the preferred embodiments of the invention.

The direct drive motors 250, 251 comprise stators 252, each stator 252 being magnetically coupled to a respective rotor 254 for magnetic interaction. The stators 252 comprise recesses 256 sized to fit the rotors 254. The rotors 254 are operationally connected to the test sectors 210 for rotational movement. Hence, when the rotors 254 rotate within the recesses 256, the test sectors 210 are driven to rotate about a common axis. The direct drive motors 250, 251 are configured to allow the test sectors 210 to be independently controlled and moved. The direct drive motors 250, 251 may be a type of permanent-magnet synchronous motor which directly drives the load, hence the number of moving parts in the direct drive motors 250, 251 are reduced as compared with a servo motor 234, 236, 238. This improves the efficiency and useable lifetime of the direct drive motors 250, 251.

Figure 8:
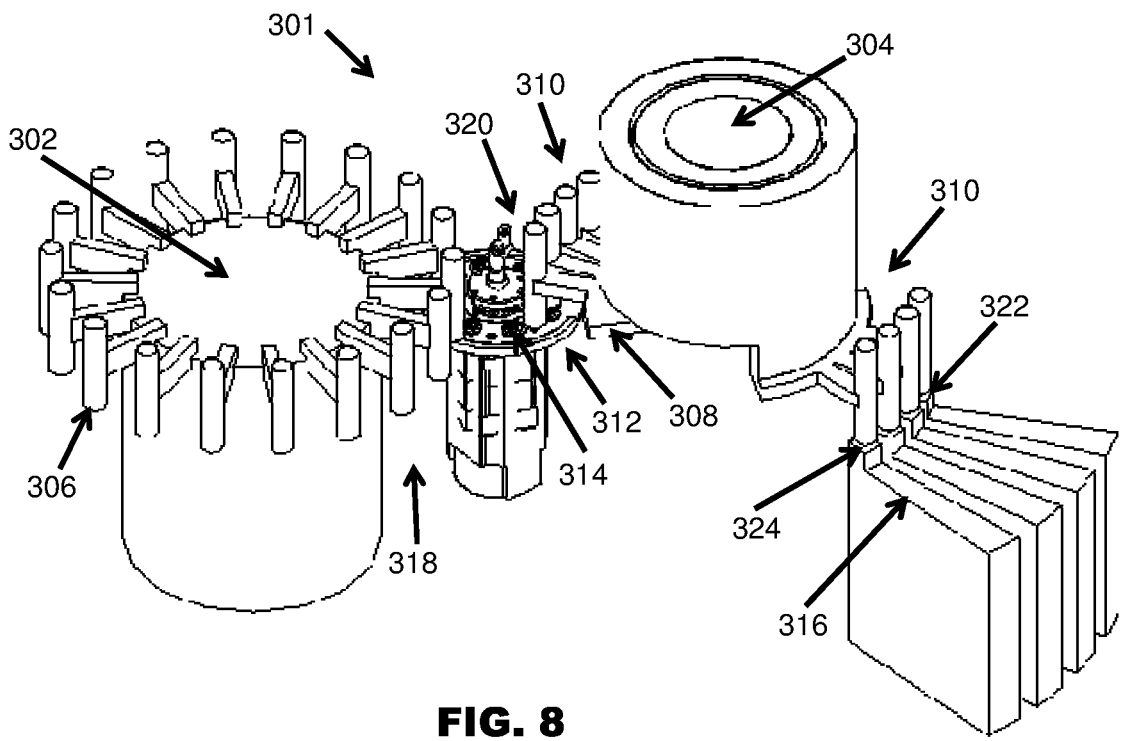
FIG. 8 shows a schematic diagram of a test handler according to a third preferred embodiment of the invention.
Figure 9:
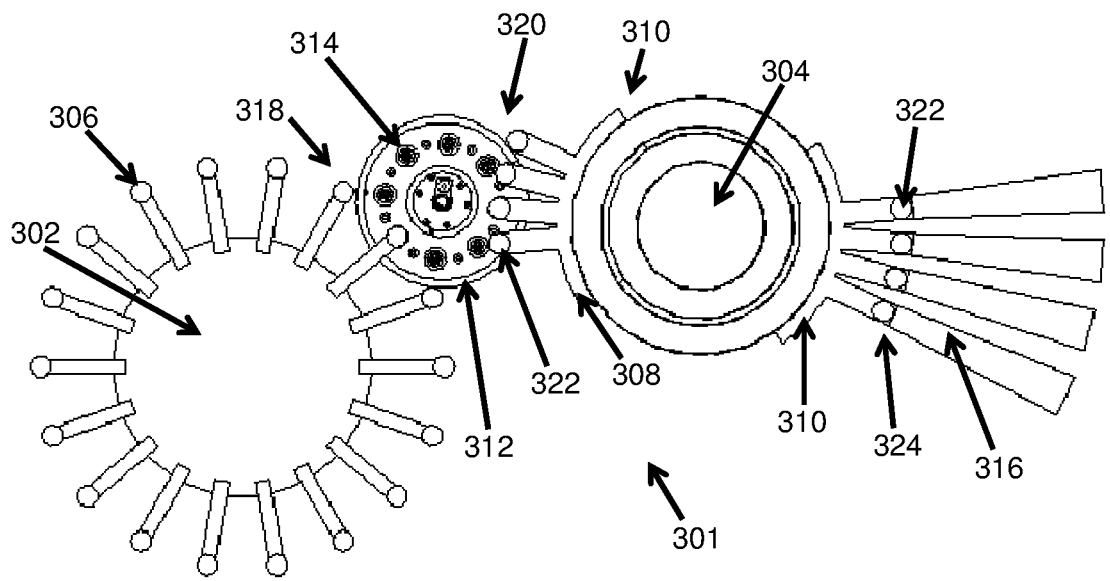
FIG. 9 shows a plan view of the test handler of FIG. 8.

FIG. 8 shows a schematic diagram of a test handler 301 according to a third preferred embodiment of the invention, while FIG. 9 shows a plan view of the test handler of FIG. 8. The test handler 301 comprises a primary rotary turret 302 comprising a plurality of pick heads 306 that are equally spaced along a circumference of the primary rotary turret 302. It also comprises a secondary rotary turret 304 spaced away from the primary rotary turret 302. The secondary rotary turret 304 comprises a multi-sector test table 308, which further includes two independently rotatably movable and separate test sectors 310. Each test sector 310 comprises component carriers in the form of a plurality of secondary pick heads 322 located alongside an arc or ached portion of the test sector 310, and each secondary pick head 322 is configured to hold or carry a respective electronic component.

Additionally, a transfer table 312 is located in-between the primary rotary turret 302 and the secondary rotary turret 304. In accordance with this embodiment, electronic components are received by the secondary rotary turret 304 indirectly (instead of directly) from the primary rotary turret 302 via the transfer table 312. The transfer table 312 has a plurality of component transporters 314 distributed along its circumference, wherein the component transporters 314 are configured to be locatable to receive electronic components from the pick heads 306 at a primary loading and unloading position 318 along a travelling path of the pick heads 306. The transfer table 312 is operative to rotate relative to the primary and second rotary turrets 302, 304 so that electronic components received at the primary loading and unloading position 318 are conveyed by rotation of the transfer table 312 to be located at a secondary loading and unloading position 320 along a travelling path of the secondary pick heads 322 of the secondary rotary turret 304.

At the secondary loading and unloading position 320, secondary pick heads 322 of a respective test sector 310 pick up electronic components from the plurality of component transporters 314, and convey the electronic components towards at least one testing device 316 for testing. The respective test sectors 310 are generally independently rotatable relative to each other about a common axis. In particular, the electronic components picked up by the secondary pick heads 322 are conveyed to testing positions 324 adjacent to the at least one testing device 316. At the multiple testing positions 324, the at least one testing device 316 is configured and operative to receive each of the electronic components from the secondary pick heads 322 for testing.

While a test sector 310 is stationary at the testing positions 324 and waiting for testing of the electronic components to be completed, the test handler 301 may simultaneously perform other actions so that such idling time does not affect the overall testing process cycle time.

For instance, while the electronic components in one test sector 310 are being loaded onto or unloaded from the component transporters 314 at the secondary loading and unloading position 320, another test sector 310 may be located at the testing positions 324 for the electronic components to be tested. Thus, once testing has completed for a batch of electronic components in a test sector 310, the other test sector 310 containing untested electronic components picked up by the secondary pick heads 322 may immediately take the place of the previous test sector 310, thus reducing idling time and resulting in a much shorter testing process cycle.

Although the present invention has been described in considerable detail with reference to certain embodiments, other embodiments are possible.

For example, the test handler 200, 300 may have more than three test sectors 210. The test handler 200, 300 may also have multiple secondary rotary turrets 204 with different numbers of test sectors 210.

Therefore, the spirit and scope of the appended claims should not be limited to the description of the embodiments contained herein.

The invention claimed is:

1. A test handler comprising:
   a primary rotary turret comprising pick heads for transporting electronic components;
   a secondary rotary turret arranged and configured to receive electronic components directly or indirectly from the primary rotary turret, the secondary rotary turret including multiple separate test sectors having component carriers for carrying the electronic components received from the primary rotary turret, wherein the multiple test sectors are rotatably movable relative to one another; and
   at least one testing device positioned along a periphery of the secondary rotary turret, wherein the component carriers of the respective test sectors are operative to convey the electronic components to a position of the at least one testing device for testing.

2. The test handler of claim 1, wherein the secondary rotary turret comprises three test sectors movable relative to one another.

3. The test handler of claim 1, wherein each test sector is rotatable on a plane, and the multiple test sectors are rotatable on a same plane.

4. The test handler of claim 1, wherein each test sector is rotatable on a plane, and the multiple test sectors are rotatable on different planes.

5. The test handler of claim 1, wherein the multiple test sectors are rotatable about a common axis.

6. The test handler of claim 1, wherein each test sector comprises an arched portion located on the secondary rotary turret.

7. The test handler of claim 6, wherein the component carriers are located adjacent to a perimeter of the arched portion.

8. The test handler of claim 7, wherein the component carriers comprise secondary pick heads for transporting electronic components.

9. The test handler of claim 6, wherein each of the arched portions is positionable at a first position corresponding to a loading and unloading position for electronic components, and a second position adjacent to the at least one testing device.

10. The test handler of claim 1, further comprising a respective servo motor for driving each test sector.

11. The test handler of claim 10, wherein each test sector is mounted on a columnar support which is coupled to the respective servo motor.

12. The test handler of claim 1, further comprising a respective direct drive motor for driving each test sector.

13. The test handler of claim 12, wherein the direct drive motor comprises a stator which is magnetically coupled to a rotor for electromagnetic interaction, and the test sector is mounted on either the stator or the rotor.

14. The test handler of claim 1, wherein the at least one testing device is configured to conduct a same type of test on the electronic components as another testing device.

15. The test handler of claim 1, further comprising a further secondary rotary turret including multiple separate test sectors.

16. The test handler of claim 15, wherein the multiple test sectors of the further secondary rotary turret comprises component carriers for receiving the electronic components directly or indirectly from the primary rotary turret.

17. The test handler of claim 16, further comprising at least one testing device positioned along a periphery of the further secondary rotary turret for receiving the electronic components conveyed by the respective test sectors of the secondary rotary turret for testing.

18. The test handler of claim 1, further comprising a transfer table located between the primary rotary turret and the secondary rotary turret, the transfer table including component transporters that are operative to convey the electronic components between the primary rotary turret and the secondary rotary turret.

19. The test handler of claim 18, wherein the component transporters are locatable at a primary loading and unloading station at a position of the primary rotary turret and at a secondary loading and unloading station at a position of the secondary rotary turret.

20. A method for testing electronic components using a test handler, comprising the steps of:
transporting electronic components with pick heads of a primary rotary turret towards a secondary rotary turret including multiple separate test sectors, wherein the multiple test sectors are rotatably movable relative to one another;
transferring the electronic components from the pick heads of the primary rotary turret directly or indirectly to component carriers comprised in a first test sector of the secondary rotary turret;
transporting the electronic components received by the component carriers of the first test sector to a position of the at least one testing device positioned along a periphery of the secondary rotary turret for testing; and
testing the electronic components received by the component carriers of the first test sector at the at least one testing device while transferring further electronic components between the primary rotary turret and a second test sector of the secondary rotary turret.

* * * * *